(12) United States Patent
Lin et al.

(10) Patent No.: US 7,656,479 B2
(45) Date of Patent: Feb. 2, 2010

(54) PIXEL STRUCTURE AND MANUFACTURING METHOD THEREOF

(75) Inventors: Hsiang-Lin Lin, Hsinchu (TW); Ching-Huan Lin, Hsinchu (TW); Te-Chun Huang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 181 days.

(21) Appl. No.: 11/767,484

(22) Filed: Jun. 23, 2007

(65) Prior Publication Data

US 2008/0231782 A1 Sep. 25, 2008

(30) Foreign Application Priority Data

Mar. 21, 2007 (TW) .............. 96109699 A

(51) Int. Cl.
*G02F 1/1333* (2006.01)
(52) U.S. Cl. ................................. 349/113
(58) Field of Classification Search .......... None
See application file for complete search history.

(56) References Cited

U.S. PATENT DOCUMENTS

| 6,208,395 | B1 * | 3/2001 | Kanoh et al. ............ 349/113 |
|---|---|---|---|
| 6,879,361 | B2 | 4/2005 | Moon et al. |
| 2003/0053016 | A1 * | 3/2003 | Kubota et al. ............ 349/113 |
| 2005/0264729 | A1 | 12/2005 | Lin et al. |
| 2006/0170845 | A1 * | 8/2006 | Lee ............ 349/114 |
| 2006/0208275 | A1 * | 9/2006 | Yun ............ 257/147 |
| 2007/0268440 | A1 * | 11/2007 | Nagano ............ 349/141 |
| 2008/0062364 | A1 * | 3/2008 | Lee et al. ............ 349/113 |

FOREIGN PATENT DOCUMENTS

CN 1936662 3/2007

* cited by examiner

*Primary Examiner*—Mike Stahl
(74) *Attorney, Agent, or Firm*—Jianq Chyun IP Office

(57) ABSTRACT

A pixel structure disposed on a substrate includes a gate, a patterned dielectric layer, a patterned semiconductor layer, a patterned metal layer, an overcoat layer and a transparent pixel electrode. The patterned dielectric layer and the gate covered thereby are disposed on the substrate. The patterned semiconductor layer on the patterned dielectric layer includes bumps and a channel above the gate. The patterned metal layer includes a source, a drain and a reflective pixel electrode connecting the drain. The source and the drain cover a portion of the channel. The reflective pixel electrode covers the bumps. The gate, the patterned dielectric layer, the patterned semiconductor layer and the patterned metal layer form a transistor on which the overcoat layer has a contact hole exposing a portion of the reflective pixel electrode. The transparent pixel electrode on the overcoat layer electrically connects the reflective pixel electrode through the contact hole.

22 Claims, 11 Drawing Sheets

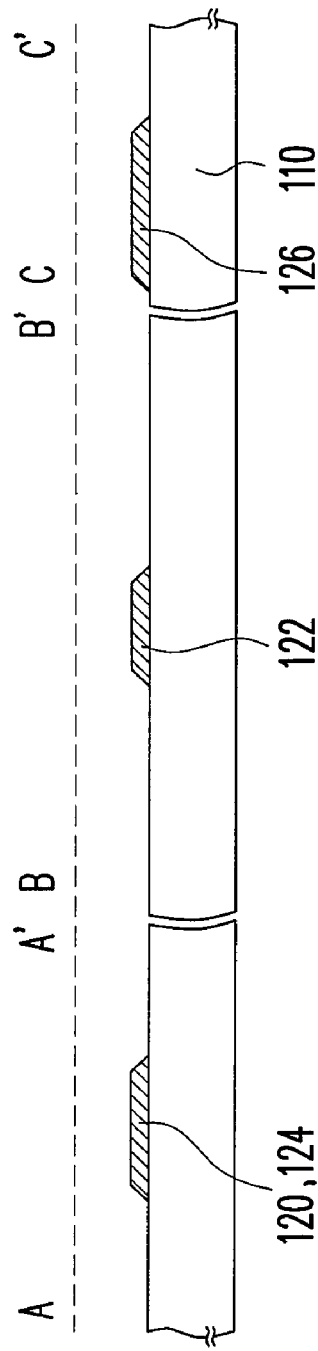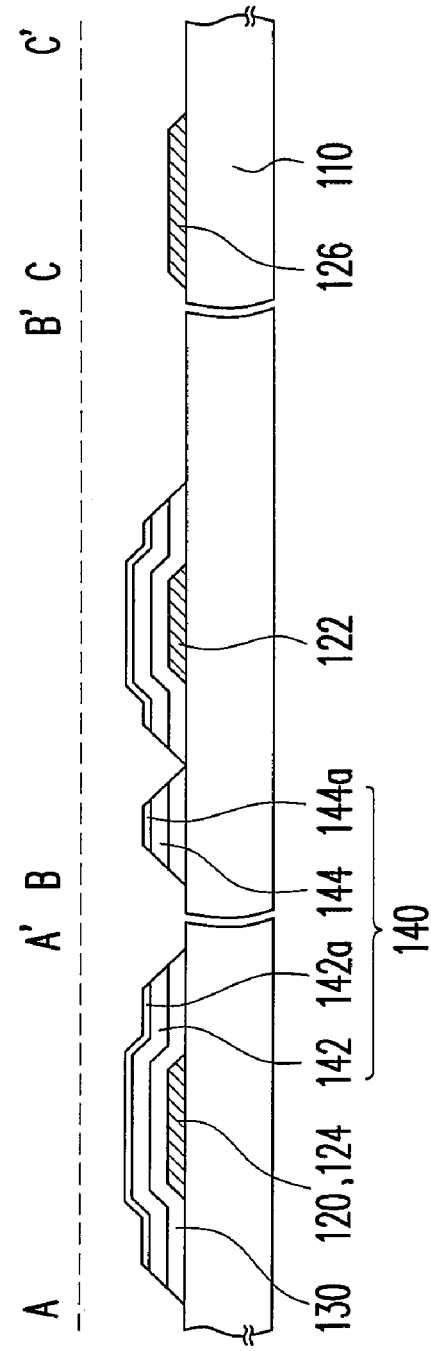

PIXEL STRUCTURE AND MANUFACTURING METHOD THEREOF

CROSS-REFERENCE TO RELATED APPLICATION

This application claims the priority benefit of Taiwan application serial no. 96109699, filed Mar. 21, 2007. All disclosure of the Taiwan application is incorporated herein by reference.

BACKGROUND OF THE INVENTION

1. Field of the Invention

The present invention relates to a pixel structure and a manufacturing method thereof, and particularly to a pixel structure having a reflective electrode and a manufacturing method thereof.

2. Description of Related Art

With the popularization of liquid crystal displays (LCDs), many portable electronic products, such as mobile phones, personal digital assistants (PDAs), or pocket PCs necessitate better display performance of the LCDs. The portable electronic products require not only a desired display effect indoors, but also a favorable image quality outdoors or in a high luminance environment.

Thus, how to maintain display quality in the high luminance environment has become one of the major trends in LCD development. In view of the foregoing, a transflective LCD has been developed according to the related art. The transflective LCD achieves the desired display effect both indoors and in a bright outdoor environment.

In a conventional transflective LCD, a pixel structure includes a reflective electrode adapted to reflect an external light, such that a reflective area is formed. In order to equalize the display effect achieved in the reflective area and in a transparent area having no reflective electrode, a padding layer is usually inserted under the reflective electrode, so as to form the transflective LCD having dual cell gap. In addition, a plurality of photoresist bumps is often disposed below the reflective electrode in the conventional pixel structure to improve the reflectivity of the reflective pixel electrode. However, the padding layer, the reflective electrode on the padding layer and the photoresist bumps are fabricated through a relatively complicated process and require more manufacturing costs. Based on the above, it is rather difficult to simplify the process of manufacturing the pixel structure of the transflective LCD while a reduced cost and a desirable quality of the pixel structure are ensured.

SUMMARY OF THE INVENTION

The present invention provides a pixel structure capable of adopting a single cell gap process to fabricate a transflective LCD.

The present invention further provides a manufacturing method of a pixel structure to fabricate the pixel structure with higher reflectivity and better quality in a simplified manufacturing process.

The present invention provides a pixel structure adapted to be disposed on a substrate. The pixel structure includes a gate, a patterned dielectric layer, a patterned semiconductor layer, a patterned metal layer, an overcoat layer and a transparent pixel electrode.

The gate is disposed on the substrate, whereon the patterned dielectric layer is disposed to cover the gate.

The patterned semiconductor layer is disposed on the patterned dielectric layer and includes a plurality of bumps and a channel disposed above the gate. In addition, the patterned metal layer includes a source, a drain and a reflective pixel electrode connected to the drain. Here, the source and the drain cover a portion of the channel, respectively. The reflective pixel electrode covers the bumps. The gate, the patterned dielectric layer, the patterned semiconductor layer, and the patterned metal layer together form a transistor. The overcoat layer is disposed on the transistor and has a contact hole to expose a portion of the reflective pixel electrode. The transparent pixel electrode is disposed on the overcoat layer and is electrically connected to the reflective pixel electrode through the contact hole.

According to an embodiment of the present invention, an ohmic contact layer can be formed on the top of the patterned semiconductor layer by performing a deposition process or a doping process. The ohmic contact layer is disposed between the source and the channel and between the drain and the channel, so as to form a thin film transistor (TFT).

According to an embodiment of the present invention, the patterned dielectric layer and the patterned semiconductor layer have identical patterns, and the patterned dielectric layer is sandwiched between the substrate and the patterned semiconductor layer.

According to an embodiment of the present invention, the patterned dielectric layer uncovered by the patterned semiconductor layer has a first thickness, and the patterned dielectric layer covered by the patterned semiconductor layer has a second thickness. The first thickness is, for example, less than or equal to the second thickness.

According to an embodiment of the present invention, the patterned dielectric layer is exclusively disposed between the patterned semiconductor layer and the substrate.

According to an embodiment of the present invention, the pixel structure further includes a passivation layer disposed between the overcoat layer and the transistor.

According to an embodiment of the present invention, a dielectric constant of the overcoat layer is, for example, in a range of 2~7, and a thickness of the overcoat layer is, for example, in a range of 0.5 μm~6 μm.

According to an embodiment of the present invention, the bumps and the patterned dielectric layer right below the bumps are defined as a protrusion, and a thickness of the protrusion ranges from 0.1 μm to 1.5 μm.

According to an embodiment of the present invention, the pixel structure further includes a common line disposed on the substrate. Here, the common line and the reflective pixel electrode disposed above the common line together form a storage capacitance.

The present invention further provides a manufacturing method of a pixel structure. First, a substrate is provided, and a gate is formed on the substrate. Next, a patterned dielectric layer is formed on the substrate, and the patterned dielectric layer covers the gate. Thereafter, the patterned semiconductor layer is formed on the patterned dielectric layer and includes a plurality of bumps and a channel disposed above the gate. After that, a patterned metal layer is formed on the substrate. The pattern metal layer includes a source, a drain and a reflective pixel electrode connected to the drain. The source and the drain respectively cover a portion of the channel. The reflective pixel electrode covers the bumps. The gate, the patterned dielectric layer, the patterned semiconductor layer and the patterned metal layer together form a transistor. Afterwards, an overcoat layer is disposed on the transistor and has a contact hole to expose a portion of the reflective pixel electrode. Eternally, a transparent pixel electrode is formed on the overcoat layer and is electrically connected to the reflective pixel electrode via the contact hole.

According to an embodiment of the present invention, the patterned dielectric layer and the patterned semiconductor layer have identical patterns, and the patterned dielectric layer is sandwiched between the substrate and the patterned semiconductor layer.

According to an embodiment of the present invention, the patterned dielectric layer uncovered by the patterned semiconductor layer has a first thickness, and the patterned dielectric layer covered by the patterned semiconductor layer has a second thickness. The first thickness is, for example, less than or equal to the second thickness.

According to an embodiment of the present invention, the patterned dielectric layer is exclusively disposed between the patterned semiconductor layer and the substrate.

According to an embodiment of the present invention, a passivation layer is further formed to cover the transistor after the formation of the patterned metal layer.

According to an embodiment of the present invention, a dielectric constant of the overcoat layer is, for example, in a range of 2~7, and a thickness of the overcoat layer is, for example, in a range of 0.5 µm~6 µm.

According to an embodiment of the present invention, the bumps and the patterned dielectric layer right below the bumps are defined as a protrusion, and a thickness of the protrusion ranges from 0.1 µm to 1.5 µm.

According to an embodiment of the present invention, a common line is further formed on the substrate during the formation of the gate. Here, the common line and the reflective pixel electrode disposed above the common line together form a storage capacitance.

In the manufacturing method of the pixel structure according the present invention, a plurality of the bumps is formed and the reflective pixel electrode covers the bumps during the formation of the patterned semiconductor layer. Through adjusting an angle and a thickness of the bumps, the reflectivity of the reflective pixel electrode can be increased. Moreover, in the pixel structure of the present invention, the overcoat layer can be disposed on the reflective electrode so as to adjust an electrical field above the reflective pixel electrode. Thereby, the transflective LCD adopting the pixel structure can achieve the same display effect both in a transmissive mode and in a reflective mode.

In order to make the above and other objects, features and advantages of the present invention more comprehensible, several embodiments accompanied with figures are described in detail below.

BRIEF DESCRIPTION OF THE DRAWINGS

FIGS. 2A through 2E are cross-sectional views along section lines AA', BB' and CC' in FIGS. 1A through 1E.

DESCRIPTION OF EMBODIMENTS

Generally, a reflective pixel electrode disposed in a pixel structure enables the pixel structure to reflect lights. Given that a transparent pixel electrode is disposed outside the reflective pixel electrode in the pixel structure, the pixel structure is able to display both in a transmissive mode and in a reflective mode. According to the related art, an adjusting layer formed under the reflective pixel electrode and photoresist bumps for increasing the reflectivity of the pixel structure are often fabricated in the pixel structure to ensure the quality thereof. However, said process complicates the fabrication of the pixel structure, leading to a reduction in production and yield of the products. Accordingly, the present invention provides a manufacturing method of a pixel structure for fabricating the pixel structure with great quality in a simplified manufacturing process.

Figure 1A:
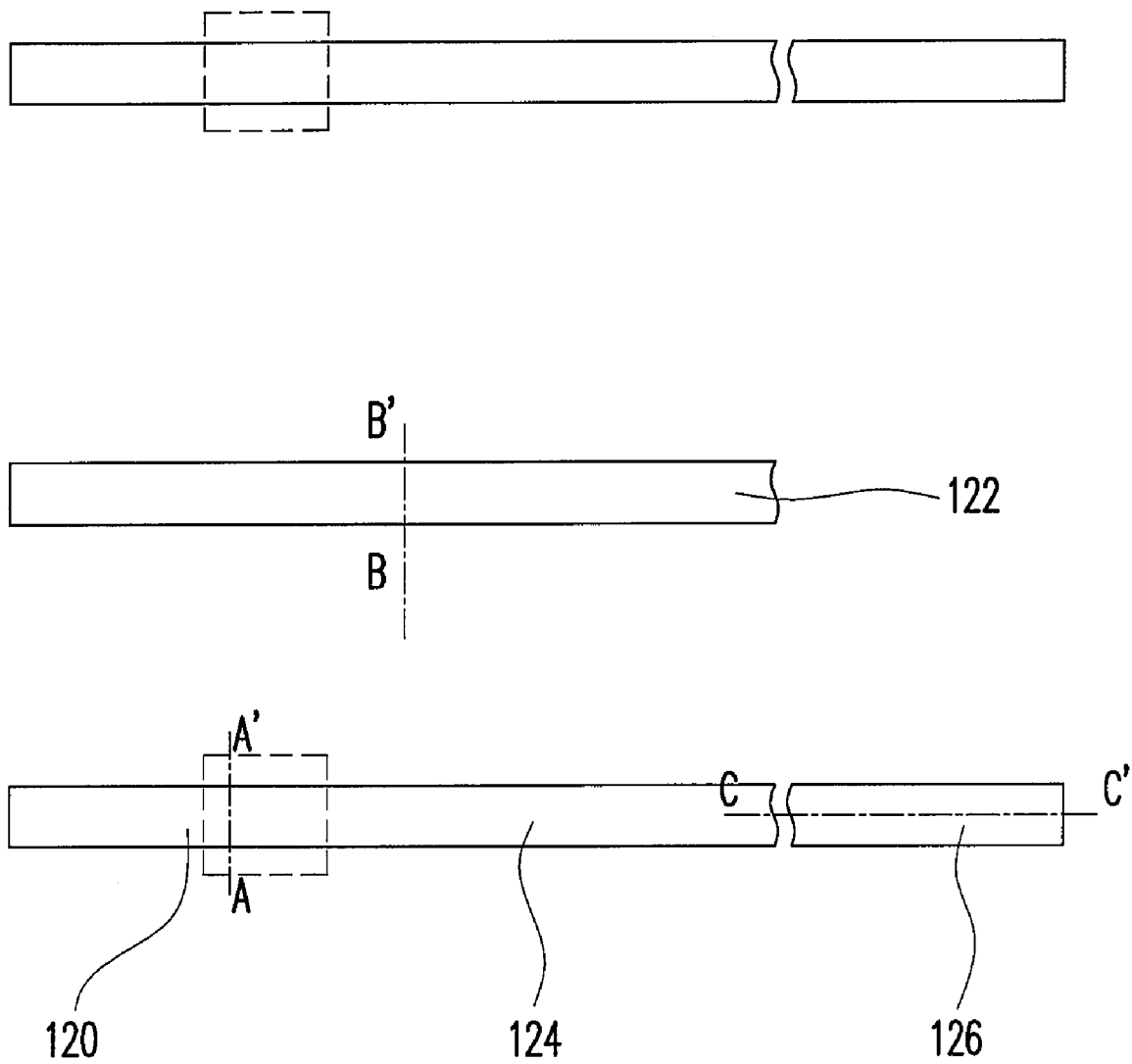
FIGS. 1A through 1E are schematic top views depicting a process of manufacturing a pixel structure according to an embodiment of the present invention.

FIGS. 1A through 1E are schematic top views depicting a method of manufacturing a pixel structure according to an embodiment of the present invention. FIGS. 2A through 2E are cross-sectional views along section lines AA', BB' and CC' in FIGS. 1A through 1E. Referring to FIGS. 1A and 2A together, a substrate 110 is provided and a gate 120 is formed thereon. A method of forming the gate 120 includes, for example, forming a gate material layer (not shown) on the substrate 110 through performing a sputtering process and then patterning the gate material layer (not shown) through implementing an etching process, such that the gate 120 is formed. In the step of patterning the gate material layer (not shown), a common line 122, a scan line 124 connected to the gate 120, and a connecting pad 126 for drivers (e.g. gate drivers or source drivers) can be together formed.

The substrate 110 may be a transparent substrate such as a glass substrate, a plastic substrate, and so forth, and a material of the gate material layer (not shown) may be either any conductive material or a combination of a variety of the conductive materials. For example, the material of the gate material layer (not shown) may be aluminum (Al), copper (Cu), molybdenum (Mo), silver (Ag), gold (Ag), an alloy thereof, or a composite metal layer thereof.

Figure 1B:
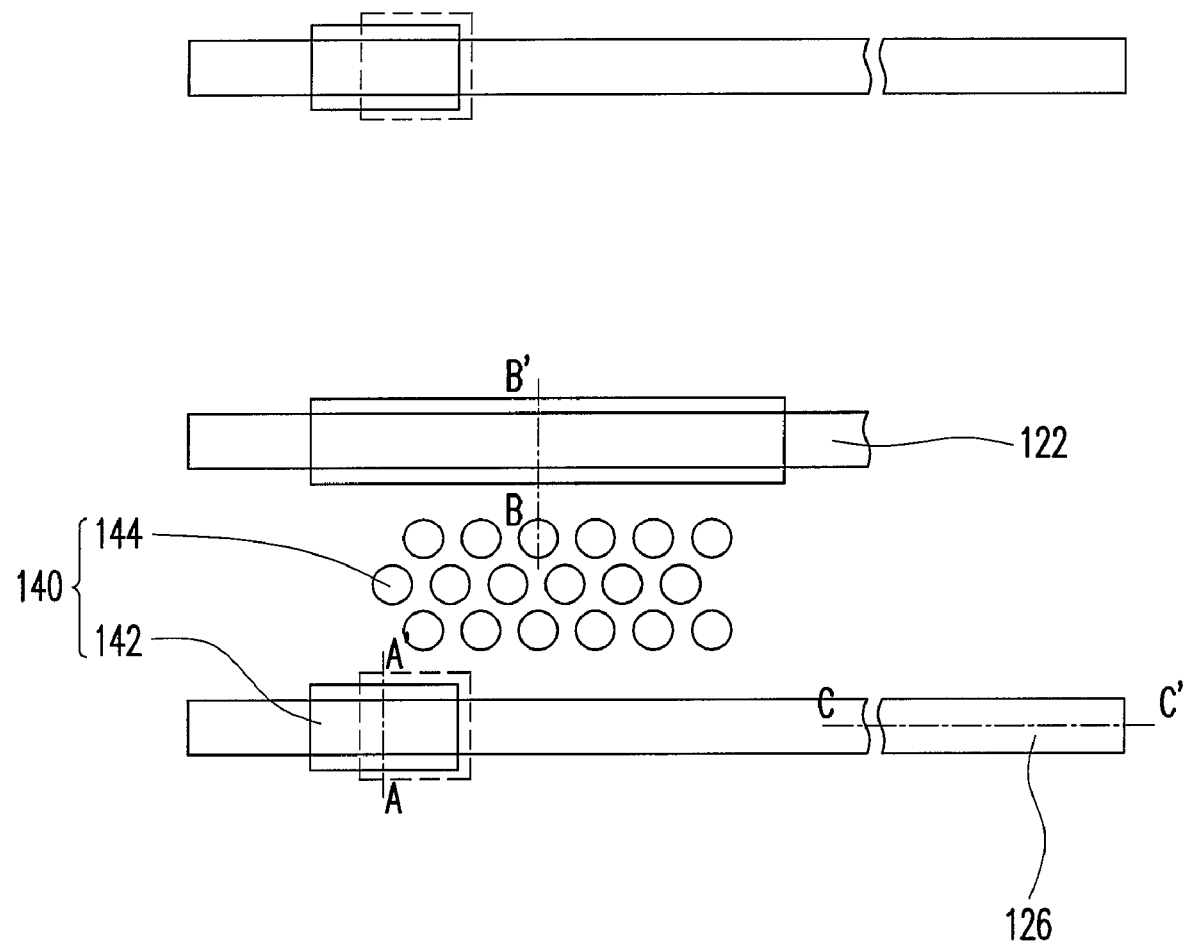
Figure 2C:
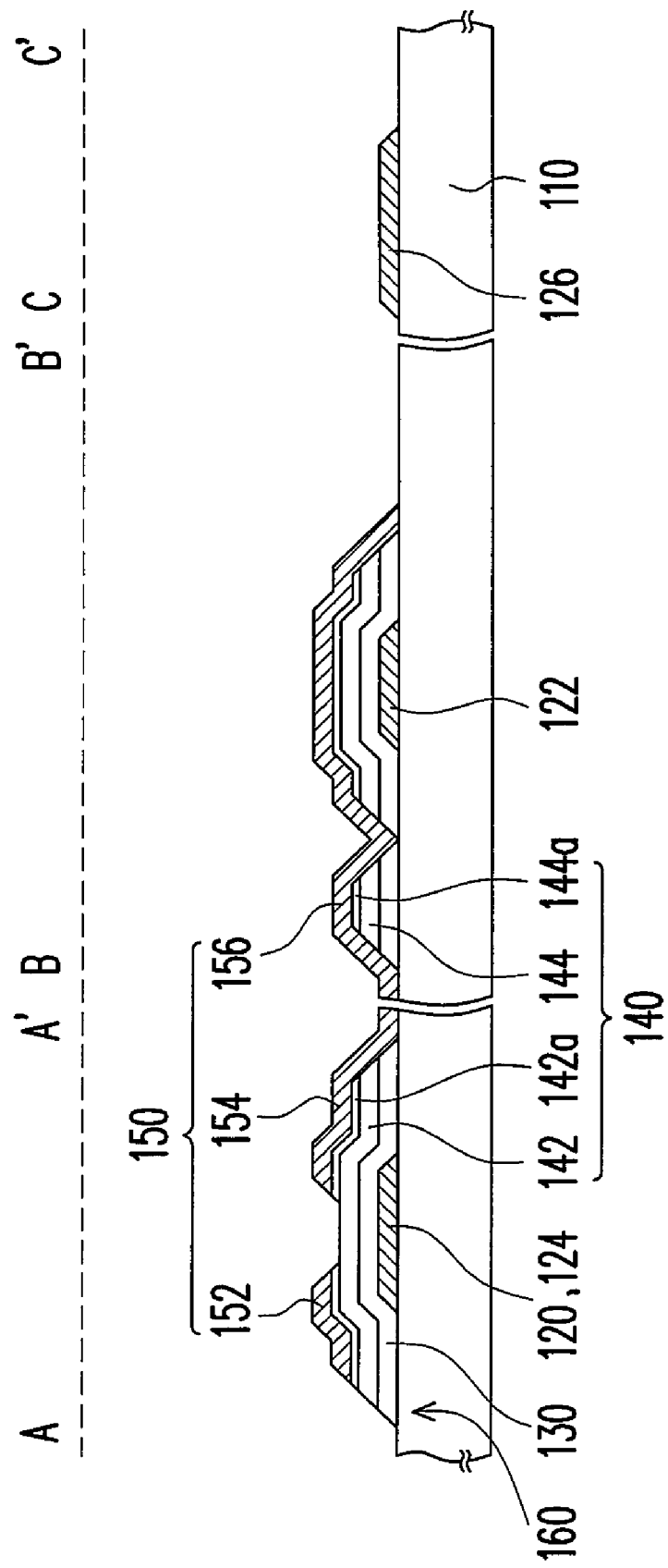

Next, referring to FIGS. 1B and 2B together, a patterned dielectric layer 130 is formed on the substrate 110, and a patterned semiconductor layer 140 is formed on the patterned dielectric layer 130. Here, the patterned dielectric layer 130 covers the gate 120, and the patterned semiconductor layer 140 includes a plurality of bumps 144 and a channel 142 disposed above the gate 120. Specifically, the patterned dielectric layer 130 is exclusively disposed between the patterned semiconductor layer 140 and the substrate 110, for example.

Particularly, a method of forming the patterned dielectric layer 130 and the patterned semiconductor layer 140 includes the following steps. First, a dielectric material layer (not shown) is formed on the substrate 110 through implementing a deposition process, and another deposition process is carried out to form a semiconductor material layer on the dielectric material layer. In addition, the top portion of the semiconductor material is defined as an ohmic contact layer, and the ohmic contact layer may be formed through performing the deposition process or a doping process. Thereafter, a patterning process is performed to remove a portion of the dielectric material layer and the semiconductor material layer. For example, the dielectric material layer and the semiconductor material layer may be removed during the same process, so as to form the patterned dielectric layer 130 and the patterned semiconductor layer 140. Here, a material of the patterned dielectric layer 130 is, for example, a dielectric material such as silicon oxide ($SiO_2$), silicon nitride (SiNx) or silicon oxynitride (SiON), while a material of the patterned semiconductor layer 140 is, for example, amorphous silicon or polysilicon.

In detail, after the patterning process is implemented, a channel 142 and an ohmic contact layer 142a may be formed above the gate 120. According to the present embodiment, for example, a thickness of the patterned dielectric layer 130 ranges from 2500 angstroms to 5000 angstroms or thinner, a thickness of the channel 142 ranges from 500 angstroms to 2000 angstroms or thinner, and a thickness of the ohmic contact layer 142a ranges from 200 angstroms to 1000 angstroms, preferably from 200 angstroms to 700 angstroms or thinner.

To be more specific, a patterned photoresist layer is used as a mask to carry out the etching process during the patterning process, such that the patterned semiconductor layer 140 is formed. Next, the same patterned photoresist layer or the patterned semiconductor layer 140 is employed as a hard mask to resume the implementation of the etching process, so as to form the patterned dielectric layer 130. Here, the patterned dielectric layer 130 and the patterned semiconductor layer 140 have identical patterns, and the patterned dielectric layer 130 is sandwiched between the substrate 110 and the patterned semiconductor layer 140. Thus, as shown in FIG. 2B, the bumps 144 and the patterned dielectric layer 130 right below the bumps 144 may together form a protrusion, for example.

In other embodiments, the manufacturing conditions of the patterning process may be adjusted to determine the removal amount of the dielectric material layer. As such, the patterned dielectric layer 130 uncovered by the bumps 144 may have a first thickness, while the patterned dielectric layer 130 covered by the bumps 144 has a second thickness. Here, the difference between the second thickness and the first thickness may pose an influence on a thickness of the protrusion. In brief, the thickness of the protrusion is adjustable by process control. The thickness of the protrusion substantially ranges from 0.1 μm to 1.5 μm, for example. On the other hand, an angle between a side of the bumps 144 or the protrusion and an upper surface of the substrate 110 may be adjusted to a range of 5°~45° in the patterning process.

Figure 1C:
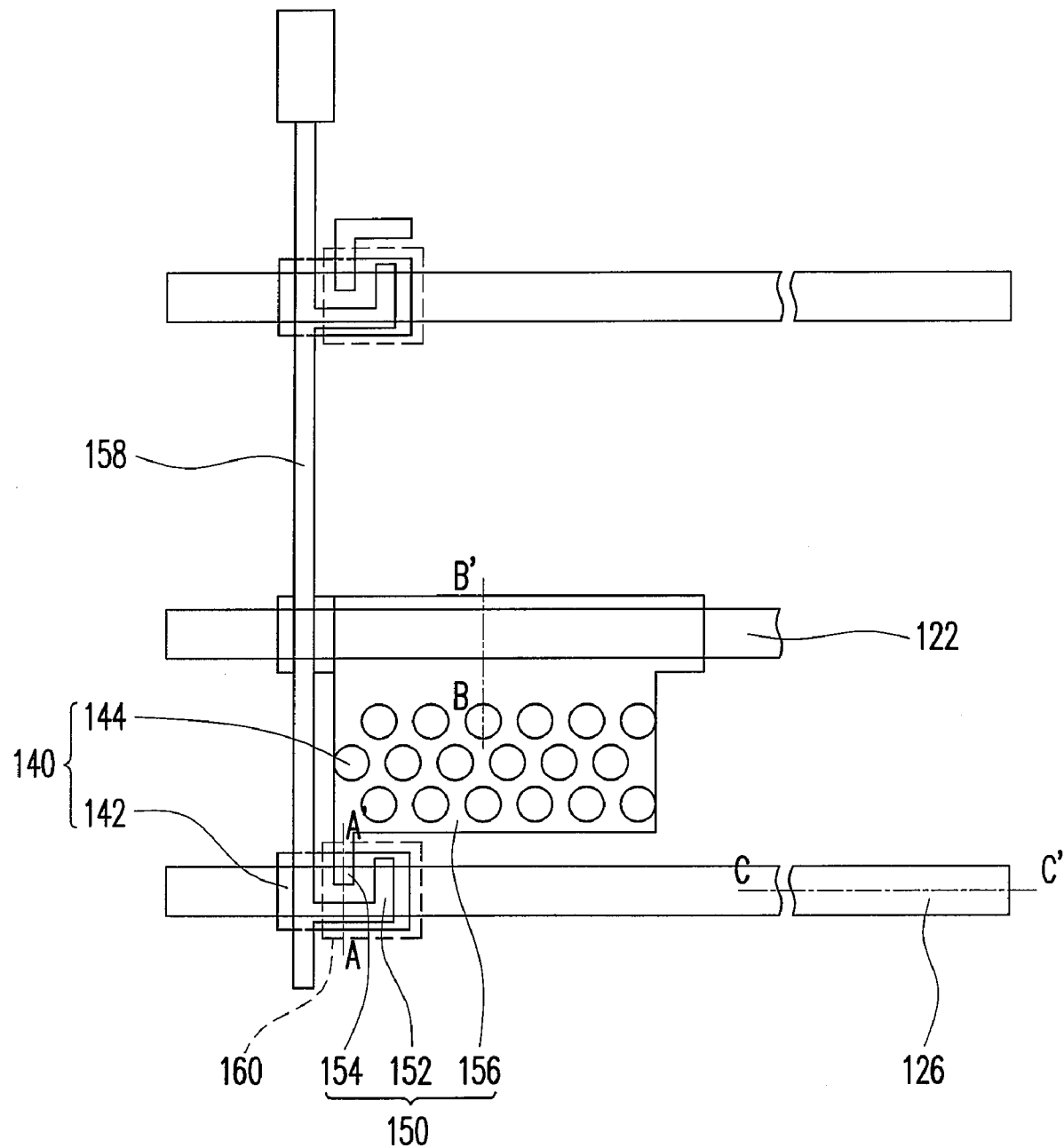

After that, referring to FIGS. 1C and 2C together, a patterned metal layer 150 is formed on the substrate 110. A method of forming the patterned metal layer 150 includes forming a metal layer on the substrate 110 and patterning the metal layer through the patterning process. The patterned metal layer 150 includes a source 152, a drain 154 and a reflective pixel electrode 156 connected to the drain 154. Here, the source 152 and the drain 154 respectively cover a portion of the channel 142, while the reflective pixel electrode 156 covers the bumps 144 (or the protrusion). During the formation of the patterned metal layer 150, a portion of the ohmic contact layer 142a above the gate 120 may also be removed to expose a portion of the channel 142 above the gate 120. The gate 120, the patterned dielectric layer 130, the patterned semiconductor layer 140, and the patterned metal layer 150 together form a transistor 160. Furthermore, a data line 158 connected to the source 152 may also be formed in the same step of forming of the patterned metal layer 150.

In the present embodiment, the patterned metal layer 150 is capable of reflecting an external light to form the reflective pixel electrode 156. In addition, the coverage of the patterned metal layer 150 on the bumps 144 is conducive to increasing the reflectivity of the reflective pixel electrode 156. In brief, an area of the reflective pixel electrode 156 and the reflectivity thereof can be increased by covering the bumps 144 (or the protrusion) with the reflective pixel electrode 156 according to the present invention. Moreover, in the present embodiment, the angle between the side of the bumps 144 (or the protrusion) and the upper surface of the substrate 110 may be adjusted to the range of 5°~45° in the patterning process. Thereby, the reflective pixel electrode 156 may be characterized by outstanding reflectivity. Substantially, a material of the reflective pixel electrode 156 or the upmost layer thereof is, for example, Ag, Al or other conductive materials having great reflectivity.

After the formation of the patterned metal layer 150, a passivation layer 172 may be formed on the substrate 110 to cover the transistor 160, for example. A method of forming the passivation layer 172 includes, for example, forming a dielectric film layer made of $SiO_2$, SiNx or SiON through performing a chemical vapor deposition (CVD) process to protect the transistor 160 and to ensure good electrical property thereof.

Figure 1D:
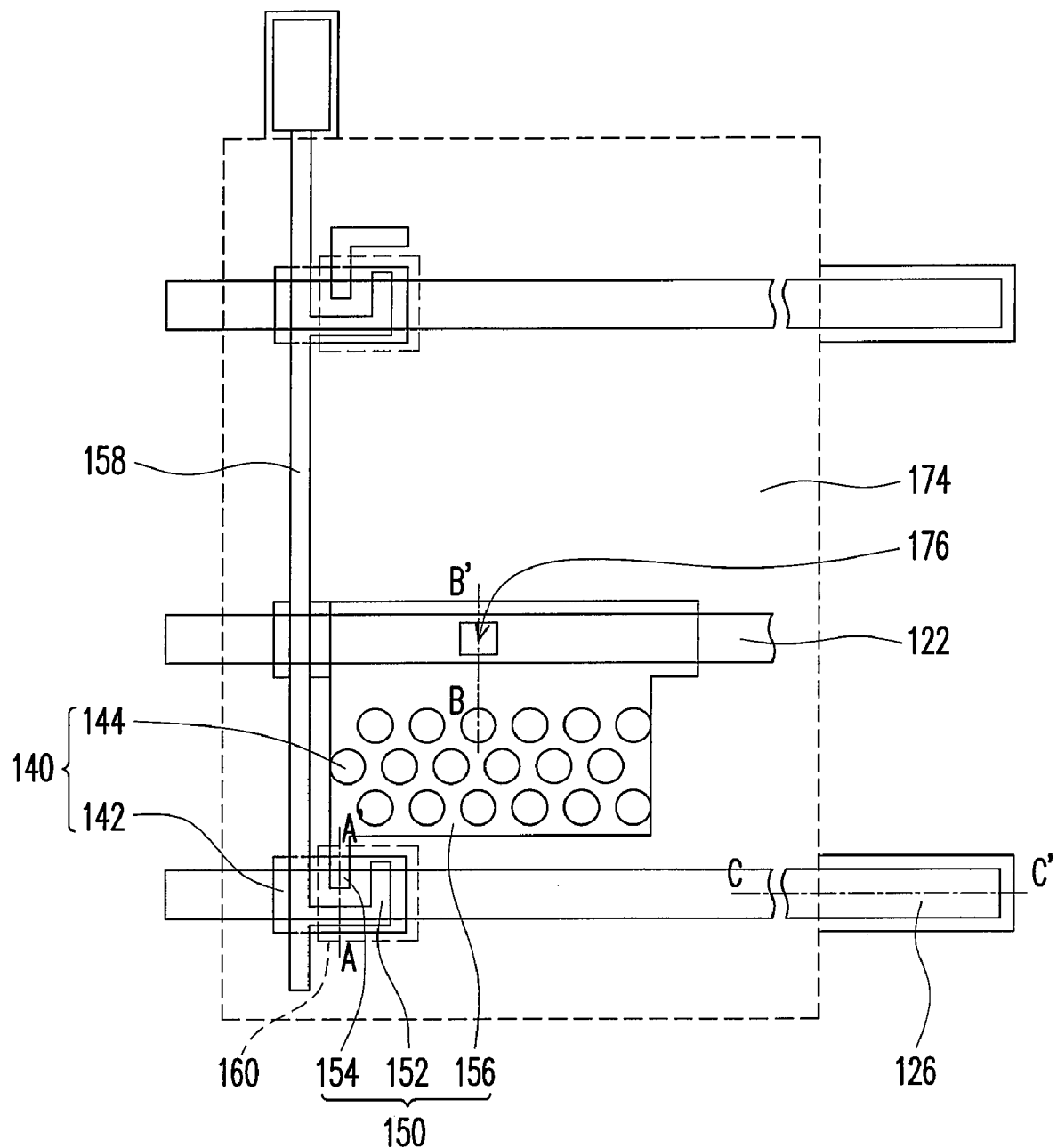
Figure 2D:
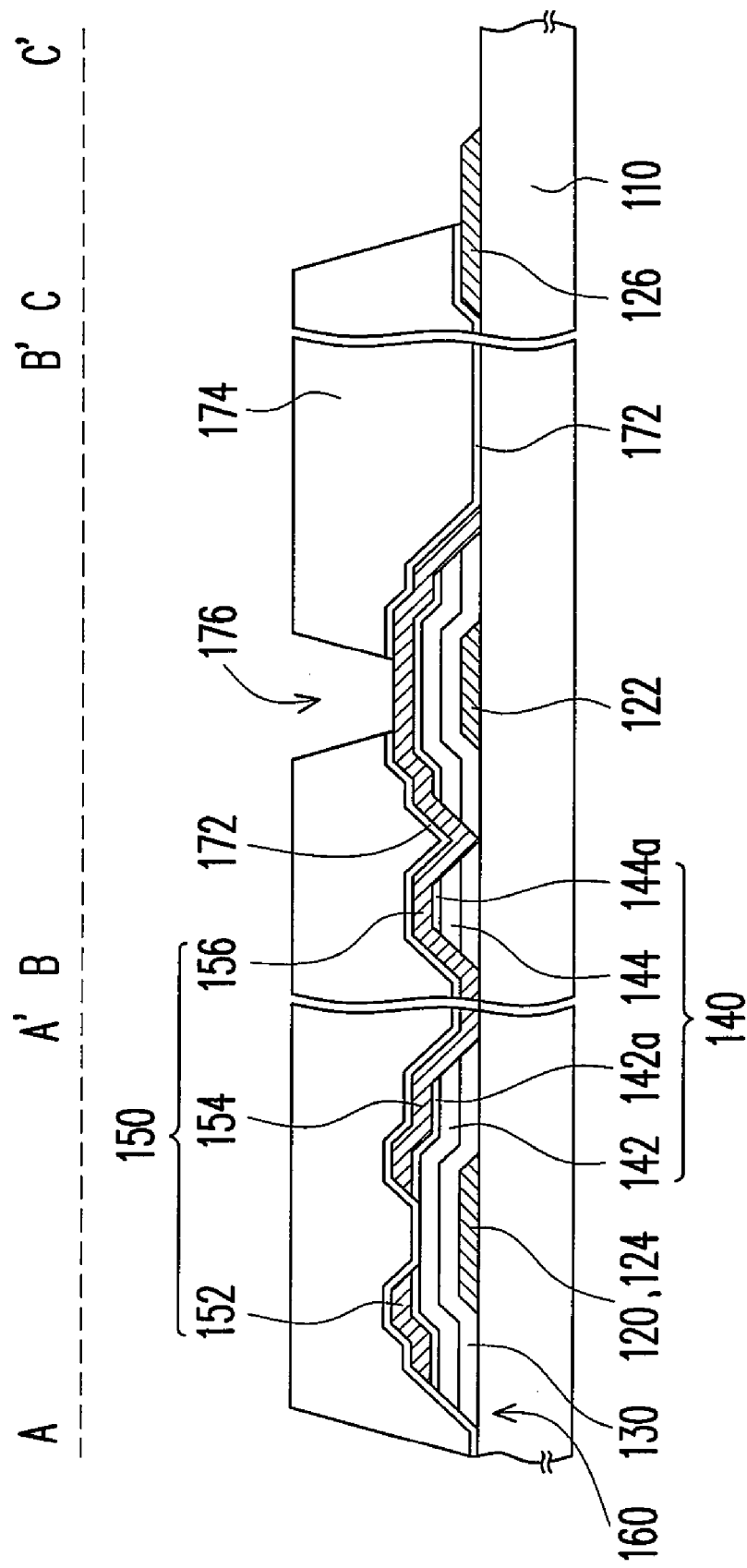

Afterwards, referring to FIGS. 1D and 2D together, an overcoat layer 174 is formed on the transistor 160, and a contact hole 176 is formed in the overcoat layer 174, so as to expose a portion of the reflective pixel electrode 156. A method of forming the overcoat layer 174 includes, for example, coating an organic dielectric material layer on the transistor 160 and forming the overcoat layer 174 having the contact hole 176 through performing a photolithography process. For example, the organic dielectric material may be acrylic resin or a photoresist material. Substantially, a dielectric constant of the overcoat layer 174 is, for example, in a range of 2~7, and a thickness of the overcoat layer is, for example, in a range of 0.5 μm~6 μm.

Figure 1E:
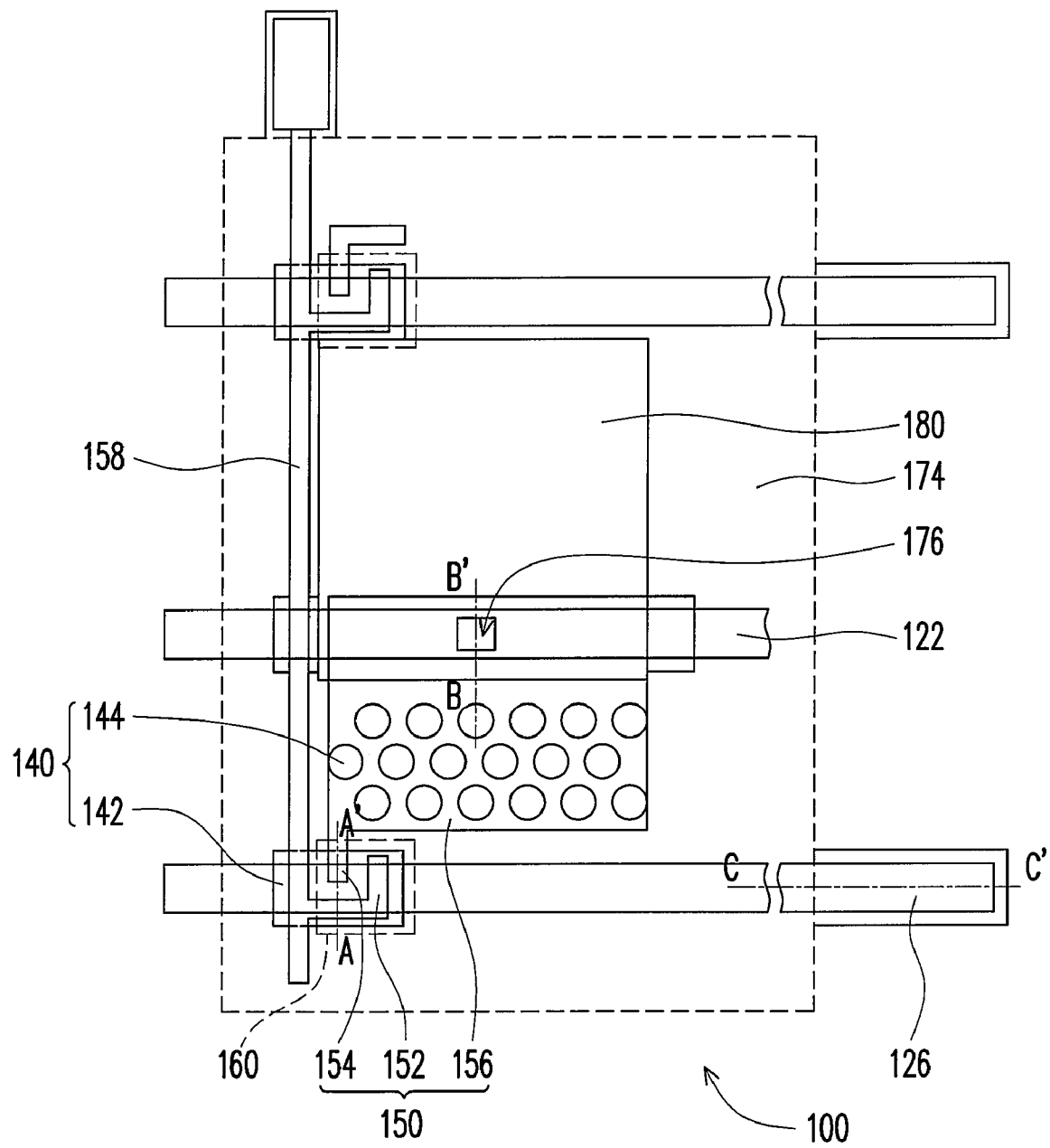
Figure 2E:
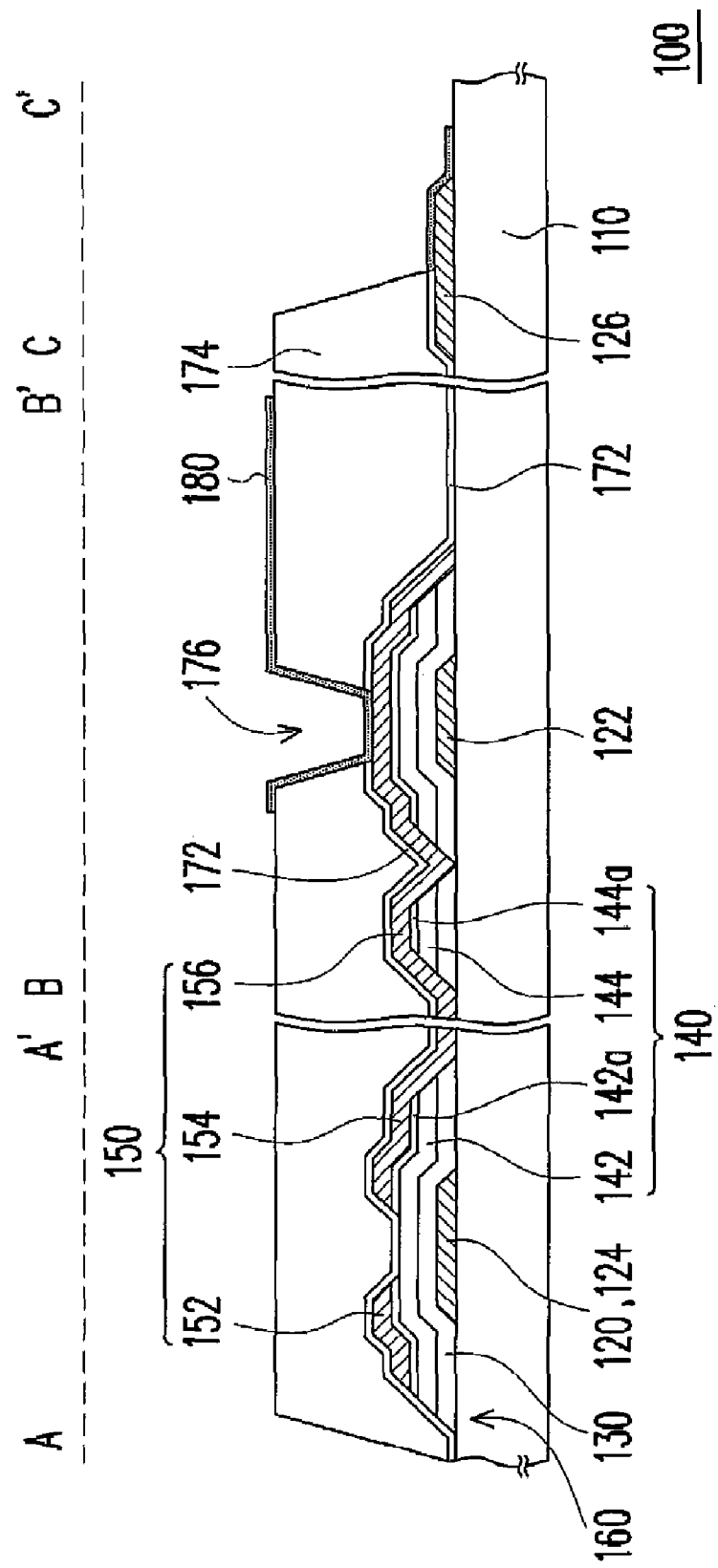

Referring to FIGS. 1E and 2E, a transparent pixel electrode 180 is formed on the overcoat layer 174. The transparent pixel electrode 180 is electrically connected to the reflective pixel electrode 174 via the contact hole 176. A method of forming the transparent pixel electrode 180 may include forming a transparent conductive material on the overcoat layer 174 and patterning the transparent conductive material, such that the transparent pixel electrode 180 is formed. The transparent conductive material includes indium-tin-oxide (ITO), indium zinc oxide (IZO), or other transparent conductive materials.

Here, the pixel structure 100 disposed on the substrate 110 includes the gate 120, the patterned dielectric layer 130, the patterned semiconductor layer 140, the patterned metal layer 150, the overcoat layer 174 and the transparent pixel electrode 180. The gate 120 is disposed on the substrate 110, whereon the patterned dielectric layer 130 is disposed to cover the gate 120. The patterned semiconductor layer 140 is disposed on the patterned dielectric layer 130, and the patterned semiconductor layer 140 includes a plurality of the bumps 144 and the channel 142 disposed above the gate 120. In addition, the patterned metal layer 150 includes the source 152, the drain 154 and the reflective pixel electrode 156 connected to the drain 154. The source 152 and the drain 154 cover a portion of the channel 142, respectively. The reflective pixel electrode 156 covers the bumps 144 (or the protrusion). The gate 120, the patterned dielectric layer 130, the patterned semiconductor layer 140 and the patterned metal layer 150 together form the transistor 160. The overcoat layer 170 is disposed on the transistor 160 and has the contact hole 176 to expose a portion of the reflective pixel electrode 156. The transparent pixel electrode 180 is disposed on the overcoat layer 174 and is electrically connected to the reflective pixel electrode 156 through the contact hole 176.

As shown in FIG. 1E, the pixel structure 100 has the transparent pixel electrode 180 capable of permitting the light to pass through and the reflective pixel electrode 156 capable of reflecting the light, and said two pixel electrodes 156 and 180 are electrically connected to each other via the contact hole 176. Therefore, the pixel structure 100 is the transflective pixel structure. In the pixel structure 100, the overcoat layer 174 poses an influence on the electrical field above the reflective pixel electrode 156, such that the electrical field above the reflective pixel electrode 156 and that above the transparent pixel electrode 180 are different. Accordingly, as the pixel structure 100 is applied to the LCDs, similar display effect can be achieved both in a reflective display area having the reflective pixel electrode 156 disposed therein and in a transmissive display area having the transparent pixel electrode 180 disposed therein through adjusting the thickness of the overcoat layer 174. In other words, unbalanced display images between the transparent display area and the reflective display area are not apt to occur when the pixel structure 100 is applied to the transflective LCD.

Currently, most of the transflective LCDs adopt the padding layers to form the dual cell gap structure, such that the display image between the transmissive display area and the reflective display area can be uniform. Comparatively speaking, according to the present invention, the pixel structure 100 with single cell gap is able to balance the display images between the transmissive display area and the reflective display area by adjusting the thickness or the material (the dielectric constant) of the overcoat layer. Thereby, the manufacturing process of the pixel structure 100 is rather simple, and the manufacturing costs thereof are relatively low. In the conventional transflective LCDs having dual cell gap, an arrangement of liquid crystal molecules are not apt to be managed at an edge of the padding layer, resulting in light leakage and further impairing the display quality of the transflective LCDs. By contrast, the pixel structure 100 of the present embodiment has single cell gap, and thus the light leakage does not easily occur.

Figure 3A:
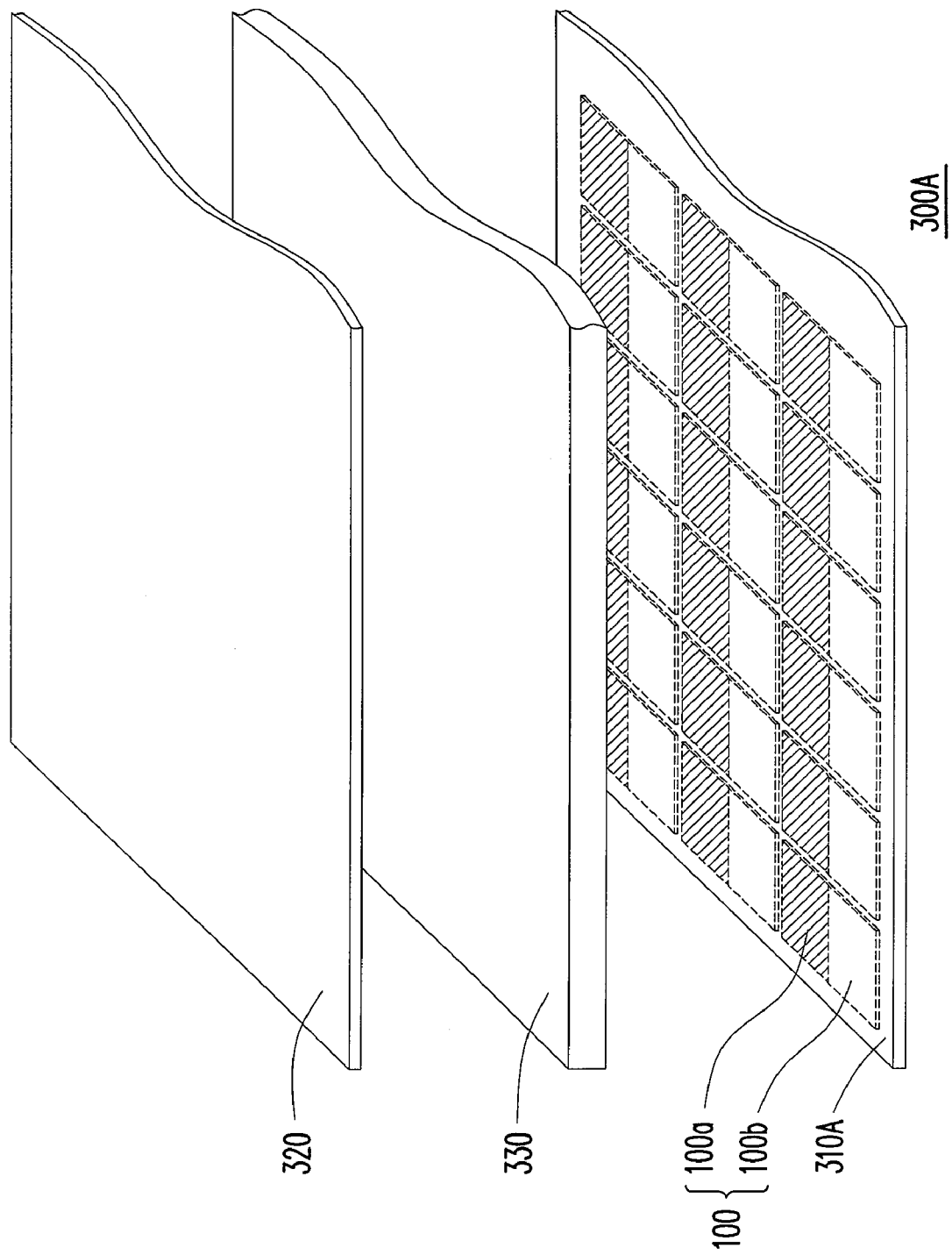
FIG. 3A is a three-dimensional view depicting a structure of a liquid crystal panel according to an embodiment of the present invention.
Figure 3B:
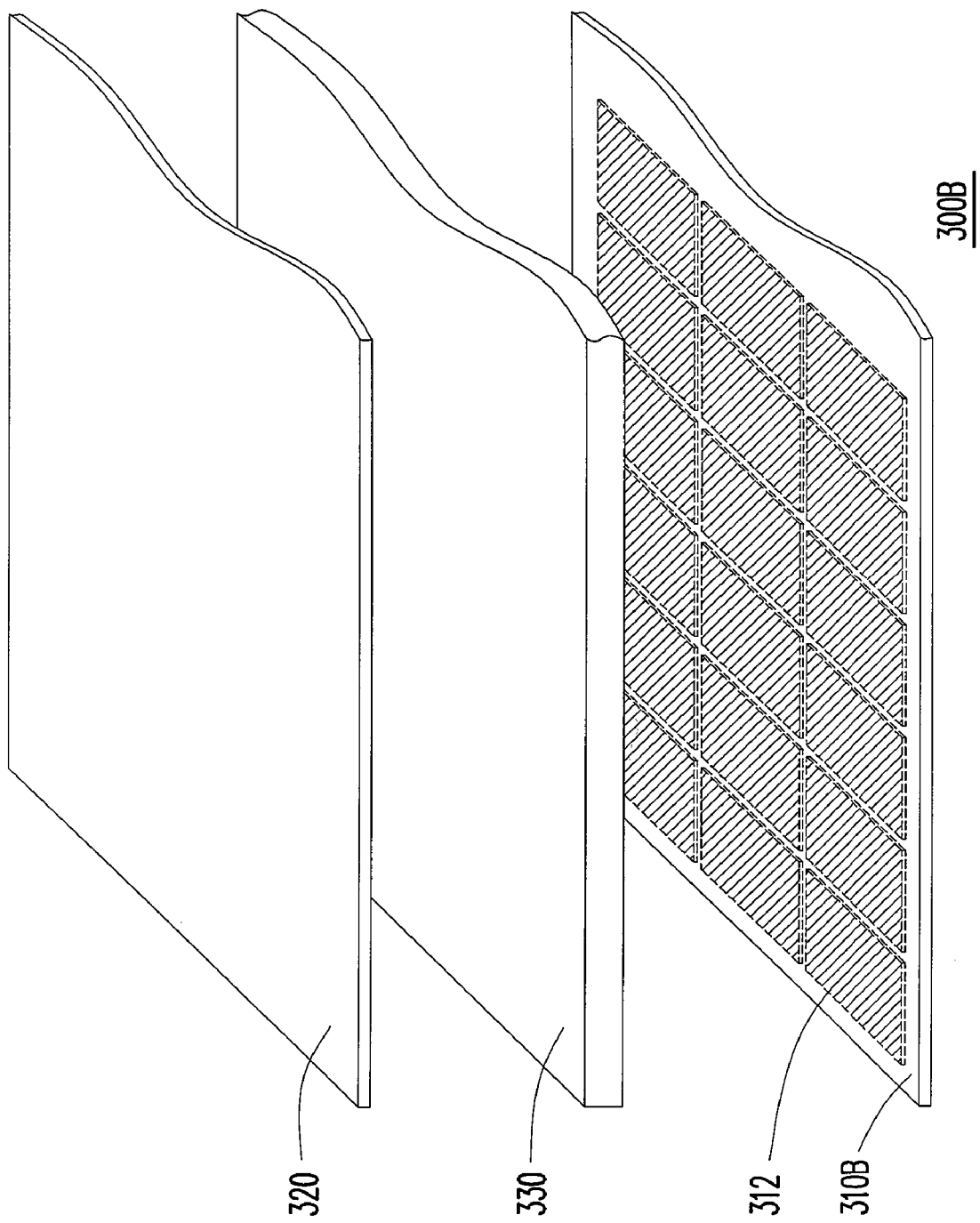
FIG. 3B is a three-dimensional view depicting a structure of a liquid crystal panel according to another embodiment of the present invention.

FIGS. 3A and 3B are three-dimensional views depicting a structure of a liquid crystal panel according to two respective embodiments of the present invention. With reference to FIG. 3A first, a liquid crystal panel 300A includes a first substrate 310A, a second substrate 320 and a liquid crystal layer 330. The first substrate 310 includes a plurality of the pixel structures 100 arranged in arrays and described in the above embodiment, and the second substrate 320 is disposed opposite to the first substrate 310A. The liquid crystal layer 330 is sandwiched between the first substrate 310A and the second substrate 320.

It should be noted that each of the pixel structures 100 has a reflective area 100*a* and a transmissive area 100*b*. Referring to FIGS. 1E and 3A together, the pixel structure 100 of the present embodiment is, for example, a transflective pixel structure 100. The reflective pixel electrode 156 is located in the reflective area 100*a* and the transparent pixel electrode 180 is positioned in the transmissive area 100*b*.

On the other hand, in the liquid crystal panel 300B, a pixel structure 312 of a first substrate 310B may be a reflective pixel structure (as shown by the pixel structure 312 in FIG. 3B). In detail, the reflective pixel electrode can be distributed in the whole display area in the pixel structure 312.

In summary, the pixel structure and the manufacturing method thereof have at least the following advantages:

In the pixel structure of the present invention, the protrusion is fabricated with use of a film layer originally comprised by the transistor, and thus no additional manufacturing process is required in the fabrication of the protrusion.

In the pixel structure of the present invention, the thickness and the configuration of the protrusion can be adjusted through varying the process conditions. Thereby, the reflectivity of the reflective pixel electrode covering on the protrusion can be effectively increased.

The pixel structure of the present invention has single cell gap, and thus the light leakage is not apt to occur.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel structure disposed on a substrate, comprising:
   a gate disposed on the substrate;
   a patterned dielectric layer disposed on the substrate to cover the gate;
   a patterned semiconductor layer disposed on the patterned dielectric layer, the patterned semiconductor layer including a plurality of bumps and a channel disposed above the gate, wherein the gate is formed by patterning a gate material layer on the substrate, the gate material layer exposes a region of the substrate after being patterned, and the bumps are located in the region exposed by the patterned gate material layer;
   a patterned metal layer including a source, a drain and a reflective pixel electrode connected to the drain, wherein the source and the drain cover at least a portion of the channel, respectively, the reflective pixel electrode covers and contacts with the bumps, and wherein the gate, the patterned dielectric layer, the patterned semiconductor layer, the source and the drain together form a transistor;
   an overcoat layer disposed on the transistor, wherein the overcoat layer has a contact hole to expose a portion of the reflective pixel electrode; and
   a transparent pixel electrode disposed on the overcoat layer, the transparent pixel electrode electrically connecting the reflective pixel electrode through the contact hole.

2. The pixel structure as claimed in claim 1, wherein the patterned semiconductor layer further includes an ohmic contact layer disposed between the source and the channel and between the drain and the channel.

3. The pixel structure as claimed in claim 1, wherein the patterned dielectric layer and the patterned semiconductor layer have identical patterns, and the patterned dielectric layer is sandwiched between the substrate and the patterned semiconductor layer.

4. The pixel structure as claimed in claim 1, wherein the patterned dielectric layer uncovered by the patterned semiconductor layer has a first thickness, and the patterned dielectric layer covered by the patterned semiconductor layer has a second thickness, the first thickness being less than or equal to the second thickness.

5. The pixel structure as claimed in claim 1, wherein the patterned dielectric layer is exclusively disposed between the patterned semiconductor layer and the substrate.

6. The pixel structure as claimed in claim 1, further comprising a passivation layer disposed between the overcoat layer and the transistor.

7. The pixel structure as claimed in claim 1, wherein a dielectric constant of the overcoat layer ranges from 2 to 7.

8. The pixel structure as claimed in claim 1, wherein a thickness of the overcoat layer approximately ranges from 0.5 µm to 6 µm.

9. The pixel structure as claimed in claim 1, wherein the bumps and the patterned dielectric layer right below the bumps together form a protrusion, and a thickness of the protrusion ranges from 0.1 µm to 1.5 µm.

10. The pixel structure as claimed in claim 1, further comprising a common line disposed on the substrate, wherein the common line and the reflective pixel electrode disposed above the common line together form a storage capacitance.

11. A manufacturing method of a pixel structure, comprising:
   providing a substrate;
   forming a gate on the substrate;
   forming a patterned dielectric layer on the substrate, the patterned dielectric layer covering the gate;
   forming a patterned semiconductor layer on the patterned dielectric layer, the patterned semiconductor layer having a plurality of bumps and a channel disposed above the gate, wherein the gate is formed by patterning a gate material layer on the substrate, the gate material layer exposes a region of the substrate after being patterned, and the bumps are located in the region exposed by the patterned gate material layer;
   forming a patterned metal layer on the substrate, the patterned metal layer comprising a source, a drain and a reflective pixel electrode connected to the drain, wherein the source and the drain respectively cover a portion of the channel, the reflective pixel electrode covers and contacts with the bumps, and the gate, the patterned dielectric layer, the patterned semiconductor layer, the source and the drain together form a transistor;
   forming an overcoat layer on the transistor;
   forming a contact hole in the overcoat layer to expose at least a portion of the reflective pixel electrode; and
   forming a transparent pixel electrode on the overcoat layer, the transparent pixel electrode electrically connecting the reflective pixel electrode via the contact hole.

12. The manufacturing method of the pixel structure as claimed in claim 11, wherein the step of forming the patterned semiconductor layer comprises sequentially forming a semiconductor layer and an ohmic contact layer disposed between the source and the channel and between the drain and the channel.

13. The manufacturing method of the pixel structure as claimed in claim 11, wherein the patterned dielectric layer and the patterned semiconductor layer have identical patterns, and the patterned dielectric layer is sandwiched between the substrate and the patterned semiconductor layer.

14. The manufacturing method of the pixel structure as claimed in claim 11, wherein the patterned dielectric layer uncovered by the patterned semiconductor layer has a first thickness, and the patterned dielectric layer covered by the patterned semiconductor layer has a second thickness, the first thickness being less than or equal to the second thickness.

15. The manufacturing method of the pixel structure as claimed in claim 11, wherein the patterned dielectric layer is exclusively disposed between the patterned semiconductor layer and the substrate.

16. The manufacturing method of the pixel structure as claimed in claim 11, further comprising forming a passivation layer to cover the transistor after the formation of the patterned metal layer.

17. The manufacturing method of the pixel structure as claimed in claim 11, wherein a thickness of the overcoat layer approximately ranges from 0.5 µm to 6 µm.

18. The manufacturing method of the pixel structure as claimed in claim 11, wherein the bumps and the patterned dielectric layer right below the bumps together form a protrusion, and a thickness of the protrusion ranges from 0.1 µm to 1.5 µm.

19. The manufacturing method of the pixel structure as claimed in claim 11, further comprising forming a common line on the substrate during the formation of the gate, wherein the common line and the reflective pixel electrode disposed above the common line together form a storage capacitance.

20. The manufacturing method of the pixel structure as claimed in claim 11, wherein the step of forming the patterned dielectric layer and the patterned semiconductor layer comprises:
   sequentially forming a dielectric material layer and a semiconductor material layer on the substrate to cover the gate; and
   simultaneously patterning the dielectric material layer and the semiconductor material layer to form the patterned dielectric layer and the patterned semiconductor layer, wherein the patterned dielectric layer covers the gate, and the patterned semiconductor layer comprises the bumps and the channel disposed above the gate.

21. The pixel structure as claimed in claim 2, wherein the ohmic contact layer is further disposed between the bumps and the reflective pixel electrode.

22. The manufacturing method of the pixel structure as claimed in claim 12, wherein the ohmic contact layer is further disposed between the bumps and the reflective pixel electrode.

* * * * *